United States Patent [19]

Suzuki et al.

[11] Patent Number: 4,476,629
[45] Date of Patent: Oct. 16, 1984

[54] METHOD AND APPARATUS FOR PRODUCING WIRE HARNESS

[75] Inventors: Yoshitsugu Suzuki, Mishima; Shogo Iizuka, Gotenba; Shigeo Kajiyama, Shizuoka; Kenji Usui, Gotenba; Masahiro Kobayashi, Susono; Toshinori Igura, Gotenba; Shigezi Kudo, Gotenba; Sanae Suzuki, Gotenba, all of Japan

[73] Assignee: Yazaki Corporation, Tokyo, Japan

[21] Appl. No.: 308,599

[22] Filed: Oct. 5, 1981

[30] Foreign Application Priority Data

Nov. 20, 1980 [JP] Japan ............................. 55-163704
Nov. 28, 1980 [JP] Japan ............................. 55-167804
Nov. 28, 1980 [JP] Japan ............................. 55-167805
Nov. 28, 1980 [JP] Japan ............................. 55-167806
Nov. 28, 1980 [JP] Japan ............................. 55-167807

[51] Int. Cl.³ ........................ H01R 43/04; B23P 23/00
[52] U.S. Cl. ..................................... 29/863; 29/564.4
[58] Field of Search .................... 29/564.4, 564.6, 861, 29/863, 748

[56] References Cited

U.S. PATENT DOCUMENTS

| | | | |
|---|---|---|---|
| 3,800,389 | 4/1974 | Brehm et al. | 29/564.6 X |
| 4,024,630 | 5/1977 | Wahren et al. | 29/564.4 X |
| 4,114,014 | 9/1978 | Shogo et al. | 29/564.6 X |
| 4,360,962 | 11/1982 | Suzuki et al. | 29/564.4 |

Primary Examiner—Howard N. Goldberg
Assistant Examiner—Carl J. Arbes

[57] ABSTRACT

A method and apparatus for automatically producing a wire harness. A plurality of wiring blocks are arranged on a workbench. Each wiring block has a wire clamping section, a wire cutting section, and a terminal press attaching section. The wire cutting section and the terminal press attaching section can be separated from the wire clamping section. This structure makes it possible to automate a series of operations including wire cutting, wire peeling, and terminal attaching operations.

33 Claims, 39 Drawing Figures

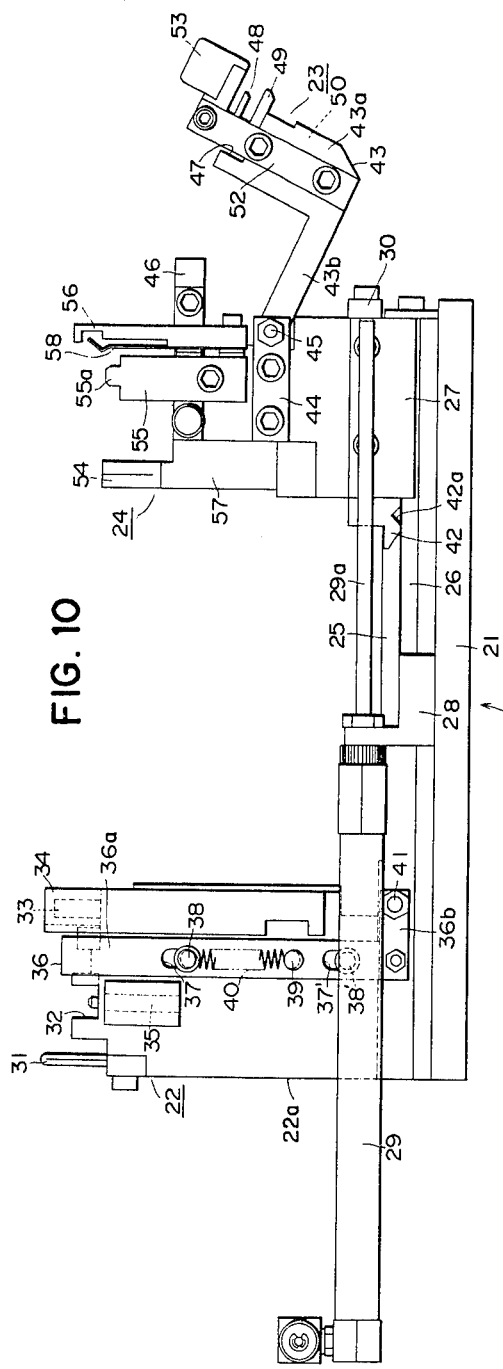
FIG. 10
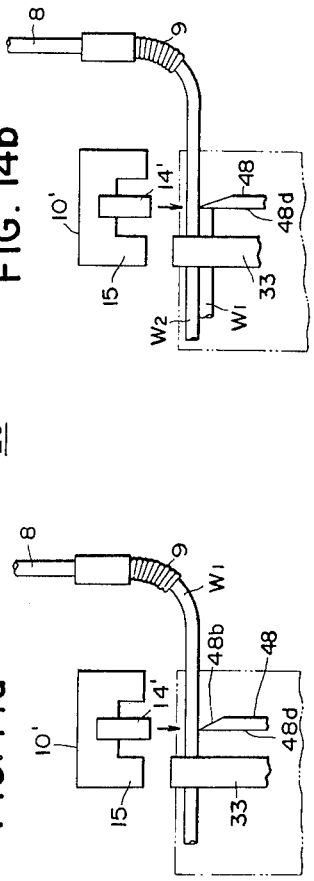
FIG. 14a
FIG. 14b

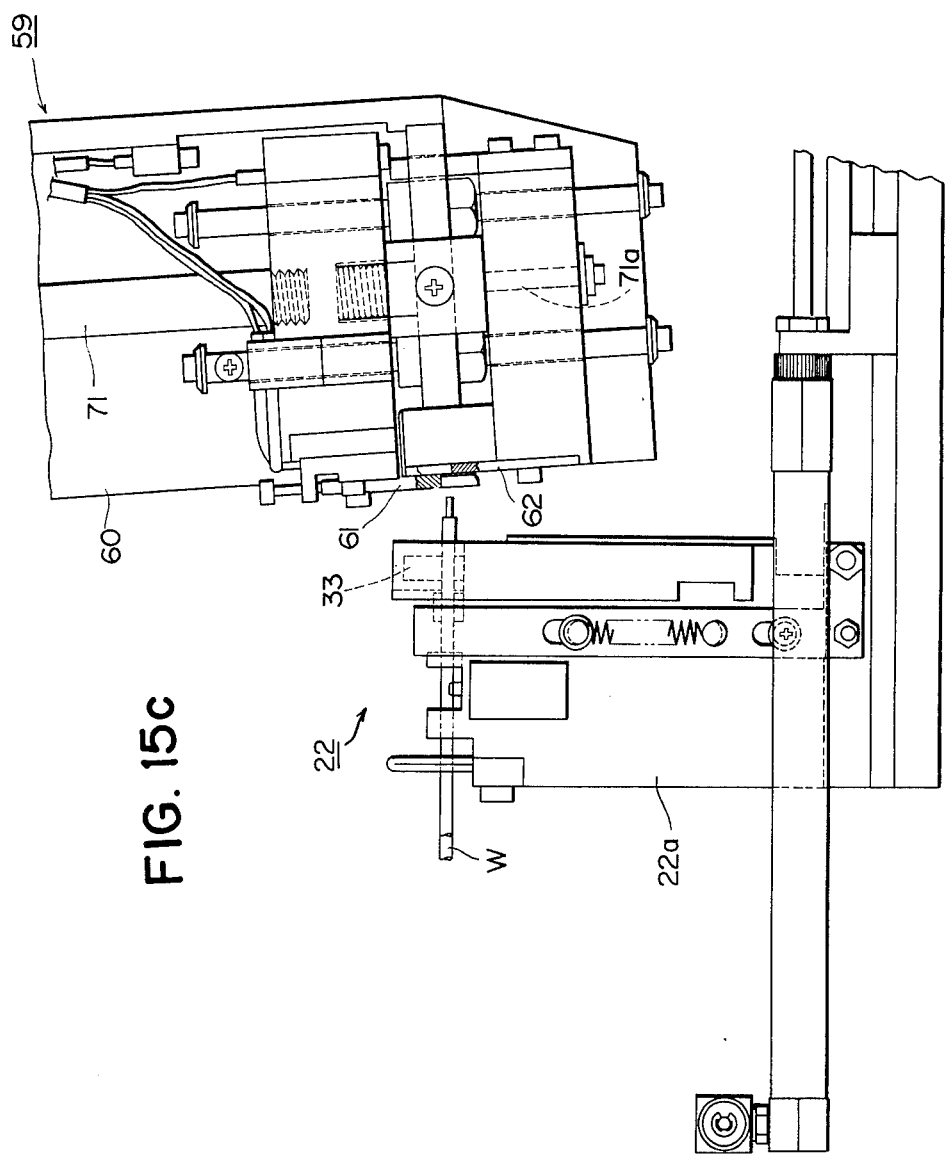

METHOD AND APPARATUS FOR PRODUCING WIRE HARNESS

BACKGROUND OF THE INVENTION

The present invention relates to a method of producing wire harness and, more particularly, to an improvement in the structure of a wiring block which joins in retaining, laying and cutting wires as well as other operations on wires in connection with such a method. The improvement is directed to avoiding fusion of a bridge conventionally relied on to rigidly retain wire ends at predetermined intervals on the bridge and, instead, permitting it to be attached removably on wire ends; the attachment of such a bridge may be performed before laying wires or during any one of successive steps from the laying of wires to the press attaching of metal terminal members onto the wire ends.

We have proposed in U.S. patent application Ser. No. 080,682 filed Oct. 1, 1979. A method and apparatus for the production of wire harnesses in which a wire is laid out and cut off at the same time and, during such an operation, its end is arranged at a suitable spacing from that of an adjacent wire or wires by a bridge. This proposal facilitates quite easy operations which will follow the wire laying and cutting operation, i.e. press attaching terminal members onto wire ends and mounting the terminal members to electric connectors.

According to the patent application mentioned above, wiring blocks are placed in preselected positions on a workbench. These blocks correspond to an intended design or pattern of a product (wire harness). A jig for laying or stretching wires is mounted elevatably on a wiring head which is driven for reciprocation along X and Y axes on the workbench. Each wiring block and the wiring jig cooperates with a wire clamp adapted to clamp and cut wires. By this cooperative mechanism wires are laid between desired wiring blocks and cut off at the same time. Thus, the technical concept of such a proposal is entirely different from that of a traditional system in which a wire is cut to a predetermined length at a first station and then each cut wire is conveyed to a second station with its opposite ends taken hold of.

After the laying of wires on wiring blocks, the workbench is bodily transferred to a fusing station where the bridge on each wiring block will be melted to firmly hold the wires thereon. Then the resultant wire harness is removed from the wiring blocks and brought to a further station where the wire ends will be peeled and terminal members will be pressed onto the peeled wire ends.

The conventional method and apparatus will be described in detail with reference to FIGS. 1-8.

Referring to FIG. 1, the apparatus includes a pair of threaded X shafts Bx extending along opposite longitudinal edges of the workbench D. Cross-beam S is movable on and along X shafts Bx and carries thereon threaded Y shaft By on which wiring head B is movably supported. X shafts Bx are driven for rotation by a first motor (not shown) whereas Y shaft By is driven by a second motor (not shown). By suitably setting the amounts of rotation of shafts Bx and By, wiring head B and wires W held by the head B can be brought to any desired position among the respective blocks A arranged on workbench D. A control unit N is adapted to store an entire process for wiring programmed on a magnetic tape (NC control). Reference number T is a reel station where wires W whose insulative coverings have different colors are stored on independent reels. Wires W are payed out to wiring head B through corresponding capstans U which serve to reduce the magnitude of tension imparted to the wires being driven by a motor (not shown) in the intended direction of wire feed.

When the wire laying and cutting operations are finished, the workbench D slides along a rail R to a next station such that the wires engaged on the wiring blocks A are subjected to a subsequent operation.

Referring to FIG. 2, there is shown a wiring block in a perspective view and generally denoted by the reference character A. The wiring block A has a series of nozzle guide pins 1 at its front upper end and a series of nozzle guide grooves 5 at its rear end. Intermediate between the pins 1 and grooves 5, the wiring block A is provided with a transverse recess 2 for receiving a bridge, pawls 3 for clamping wires and a surface 4 against which the cutting edge of a cutter will abut as will be described. A winged screw 6 is threaded into the wiring block A to open or loosen the clamping pawls 3 when required.

FIG. 3 shows in partly sectional side elevation the wiring head B which runs along X and Y axes on the workbench.

As depicted in side elevation in FIG. 3, wiring head B includes a frame or a head body 7, a plurality of wiring jigs 8 located on top of frame 7 and clamping jig 10 positioned below the frame 7. The jigs 8 and 10 reciprocate and rotate relative to a predetermined position.

Annular member or wiring jig mount B1 for mounting wiring jigs 8 is mounted to frame 7 rotatably through a plurality of guide rollers B2. Jig mount B1 is operatively connected to a limited speed motor B3 circulate in a horizontal plane.

Wiring jigs 8 are passed through respective tubular guides B4 which are spaced equidistant along the circumference of jig mount B1. Each of the wiring jigs 8 is locked at a preselected level by a knock pin B5.

Differently colored wires W are payed out from the reel station T to individual wiring jigs 8. Jig mount B1 when driven by motor B3 will bring a selected wiring jig 8 to a predetermined position P in FIG. 4.

Each jig 8 reaching the position P is reciprocated vertically in accordance with the action of unit B6. Denoted B7 is a motor adapted to drive capstan B8 provided on the jig 8.

As shown in detail in FIG. 5, the clamping jig 10 has a front end clamping plate 11, a wire end guide plate 12, a cutter 14 and a rear end clamping plate 15 which are arranged in succession from the front end to the rear end of the jig. The guide plate 12 is backed up by a coiled compression spring 13. The guide plate 12 and cutter 14 extend downward somewhat beyond the lower ends of the front and rear end clamping plate 11 and 15 and in parallel vertical planes which are perpendicular to those of the latter. The clamping plates 11 and 15 are positioned on the jig 10 symmetrically to each other with respect to the cutter 14.

A bridge C which will be received in the recess 2 of the wiring block A is shown in detailed perspective in FIG. 6. The bridge C serves to hold wire ends at predetermined intervals rigidly therewith. The bridge C is shown to comprise a base 16 in the form of a narrow elongate strip and a series of paired upright pieces 17, 17' which are spaced a predetermined distance from each adjacent pair. In use, the bridge C will be cut into a certain length which corresponds to the selected number of wires to be carried on the bridge. The bridge C is usually made of a thermoplastic resin of the same kind as that of the insulator on a wire W. After wires are laid on the bridge C, the upright pieces 17, 17' on the bridge will be fused to rigidly retain the wires therewith.

The wiring block A, wiring jig 8 and clamping jig 10 will work in cooperation to lay, clamp and cut a wire as will be described hereinafter with reference to FIGS. 7a-7c.

At the start of a wiring operation, a bridge C is placed in the transverse recess 2 of a wiring block A-1 and the nozzle 9 is held in engagement with the bridge C and adjacent nozzle guide pins 1 while being bent in the manner indicated in FIG. 7a. A predetermined length l of wire W emerging from the end of the nozzle 9 is positioned in an upper portion of the clearance space between coactive clamping pawls 3.

As the clamping jig 10 is lowered to a position shown in FIG. 7b, the wire end guide plate 12 on the jig 10 is brought into contact with the wire W to guide it to a point midway between the opposite clamping pawls 3. Then the front end clamping plate 11 presses the wire W until the latter becomes nipped between the clamping pawls 3. At the same time, the wire W is laid between adjacent upright pieces 17, 17' on the bridge C.

It will be seen that, though that part of the wire W emerging from the nozzle 9 may be somewhat bent at the start of a wiring operation, the guide plate 12 and front end clamping plate 11 cooperate to straighten the wire for thereby ensuring steady restraint of the wire on the wiring block A-1.

Suppose that the wire W stretched from the wiring block A-1 has arrived at a second wiring block A-2 shown in FIG. 7c which is opposed to the wiring block A-1 and defines a point where said wire laying operation is to terminate. The nozzle 9 moves onto the second wiring block A-2 through between adjacent nozzle guide pins 1 and contacts with the upper end of a corresponding nozzle guide groove 5 while bending itself between the pins 1 and groove 5. In the condition shown in FIG. 7c, the wire W outside the nozzle 9 has been stretched in a rectilinear way from the wiring block A-1 to the wiring block A-2 by way of the nozzle guide pins 1 and a pin or pins (not shown) studded on the workbench. Therefore, the wire W is positioned on the wiring block A-2 in alignment with the center of the clearance space between opposite clamping pawls 3 and that between opposite pieces 17, 17' on the bridge C.

As the clamping jig 10 is lowered onto the wiring block A-2, the rear end clamping plate 15 presses the wire W this time in place of the front end clamping plate 11 until the wire W becomes retained between the clamping pawls 3. At the same time, the cutter 14 on the jig 10 cuts the wire W on the surface 4 leaving another predetermined length l of wire protruded from the nozzle 9.

Thereupon, the motor M (see FIG. 3) is energized to rotate the clamping jig 10 by a regulated angular distance which will locate the jig 10 right behind the wiring jig 8. This sets up the same situation as that in FIG. 7a for performing another wiring operation. In this manner, the wiring head B with the wiring jig 8 and clamping jig 10 is moved between desired wiring blocks to lay and cut wires in a continuous fashion while causing opposite ends of each wire W to be located between adjacent upright pieces 17, 17' on a bridge C and retained by adjacent pawls 3.

FIG. 8 illustrates an exemplary design of a wire harness E which has wires W laid between wiring blocks A-1 to A-7 which are placed on the workbench D. Pins 18 are studded on the workbench to hold the wires W in desired orientations. The wires W are suitably bundled up by tapes 19 as indicated.

The workbench D carrying the wire harness E is transferred along guide rails R to the next working station whereat the wires W and bridges C are rigidly connected together by fusing with use of a fusing jig (not shown). Then the wire harness E is removed from all of the wiring blocks A-1 to A-7. Finally, the insulative covering having the predetermined length l of each wire protruding from a bridge C is peeled off and the peeled wire is fitted with a metal terminal member by a device not illustrated in the drawings.

As has been described, the upright pieces 17, 17' on bridge C are connected rigidly with wire ends by fusing them after a wire laying step. In view of the fact that independent devices are employed to carry out the wire laying step and the subsequent steps of wire end peeling and fitting terminals onto the peeled wire ends, the connection by fusion will eliminate difficulties in the course of transfer of a wire harness from one device to the other or during storage of such a wire harness. Also, a wire harness of this type will make various operations such as peeling easy. It is frequently experienced, however, that the bridges of a wire harness become no longer functional once the terminals on the wire ends are fixed to a connector housing for example.

SUMMARY OF THE INVENTION

It is an object of the present invention to provide a method of producing a wire harness which, by improving the structure of a wiring block, peels wires and attaches terminal members to the peeled wires in a continuous procedure without requiring removal of laid wires, permits bridges to be detachably fitted to wires at any desired stage of production, and allows them to be removed from the wires with ease as they become no longer functional.

In a method of producing a wire harness including the steps of placing wiring blocks on a workbench at spacings which conform to a selected design of a wire harness, laying a wire from one of the wiring blocks out to another after locking the wire to the first wiring block, retaining the wire on the second wiring block and cutting the wire, laying wires in the same way between desired ones of the wiring blocks in succession, and peeling ends of the wires and pressing metal terminal members rigidly onto the peeled wire ends; an improvement embodying the present invention is characterized in that detachable bridges are placed on the wiring blocks before laying the wires or the bridges are attached to the ends of wires in the course of any one of the steps of laying wires to fitting the terminal members onto the wires, thereby retaining wire ends at predetermined common spacings. Other features and advantages of the present invention will become apparent from the the following description and the accompanying drawings.

BRIEF DESCRIPTION OF THE EMBODIMENTS

FIG. 10 is a side elevation showing the wiring block in its separate condition;

Figure 17:
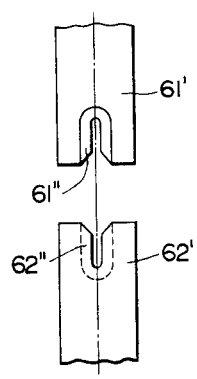
Figure 18A:
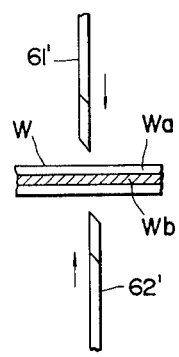
Figure 18B:
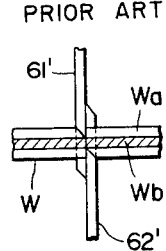
Figure 13A:
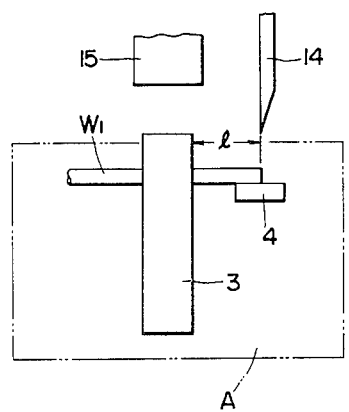
Figure 13B:
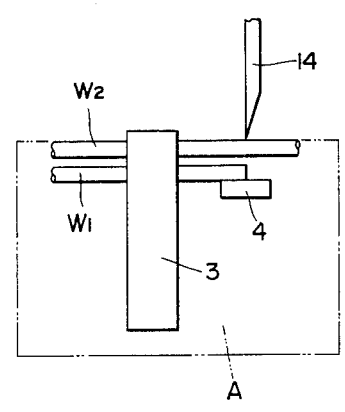
Figure 15A:
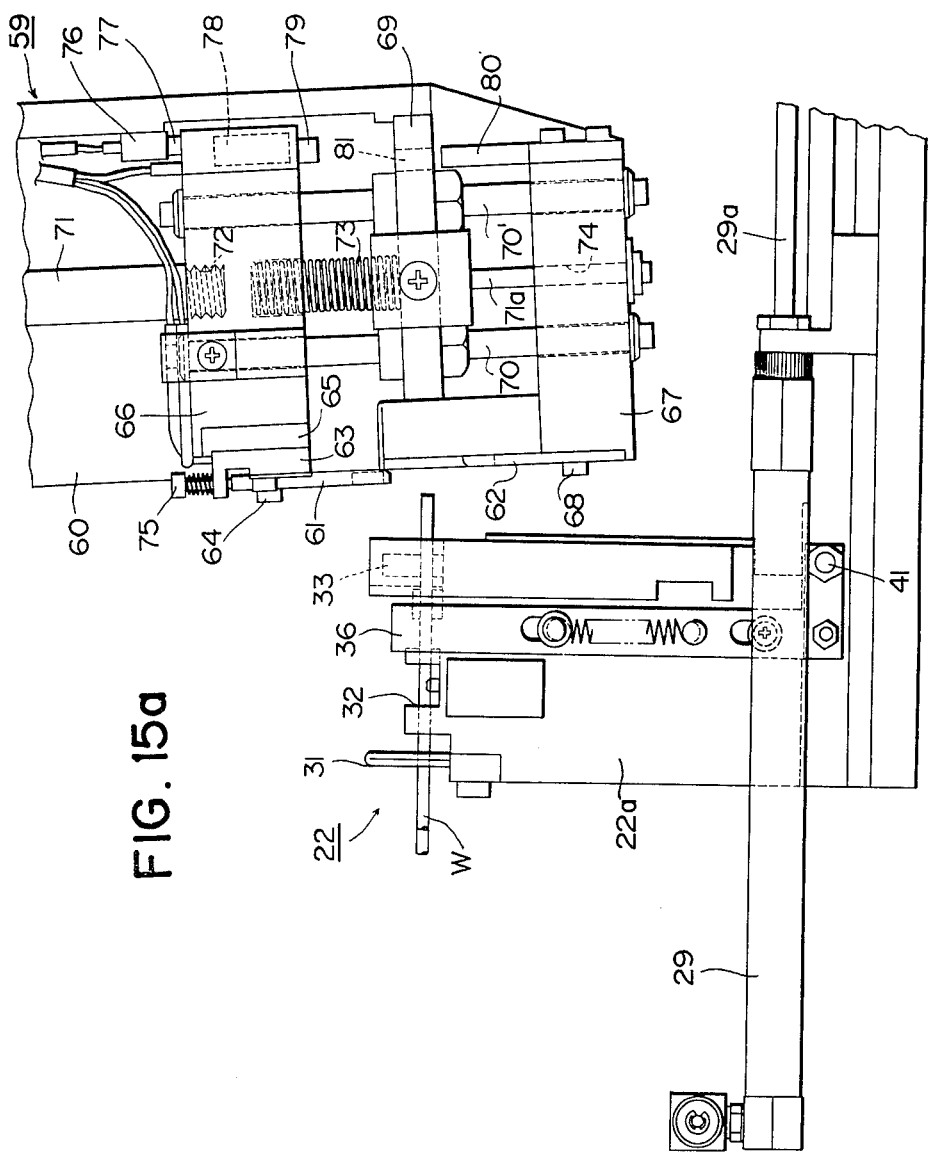
Figure 15B:
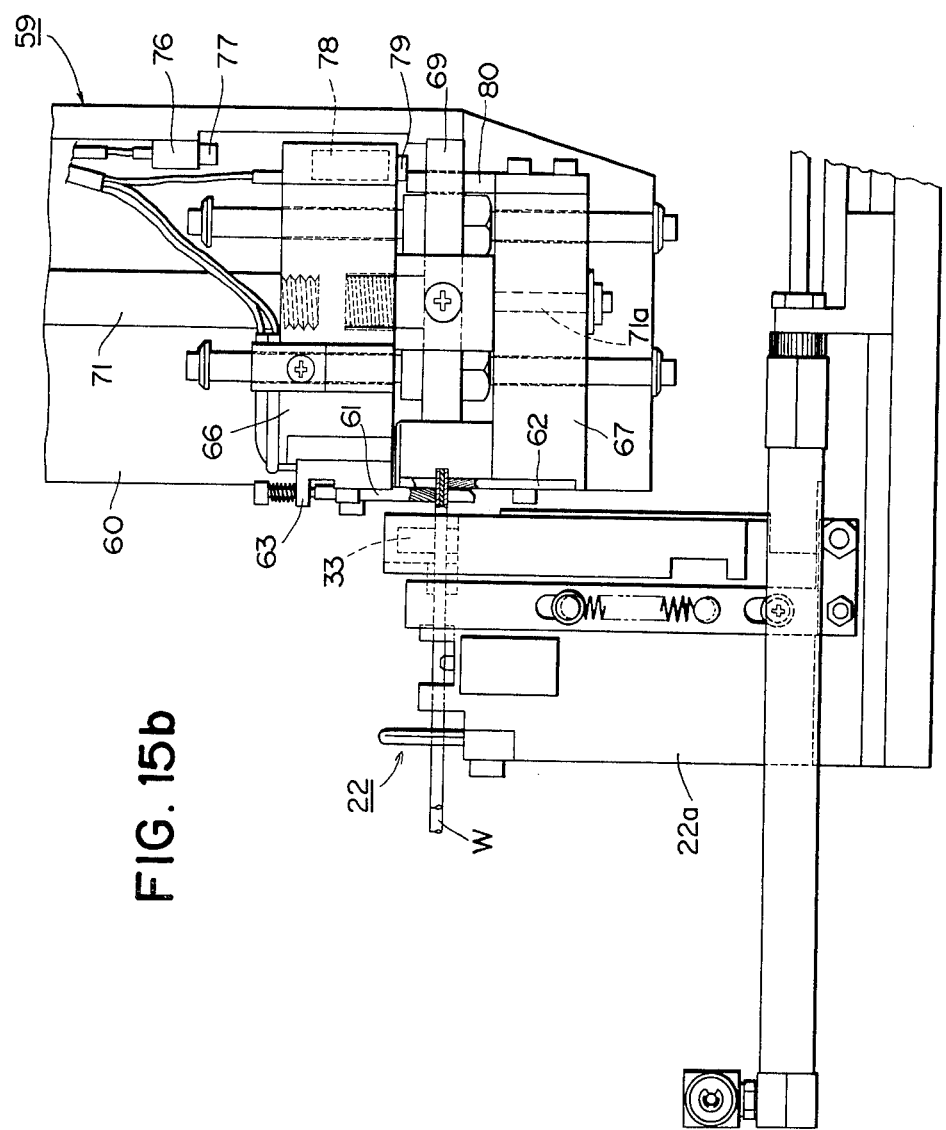
Figure 19A:
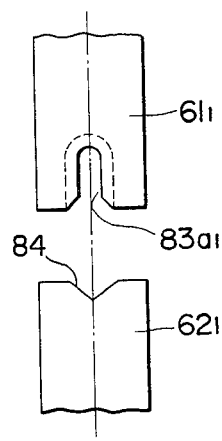
Figure 19B:
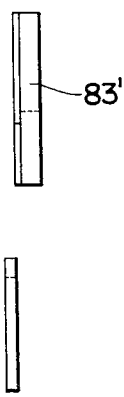
Figure 21A:
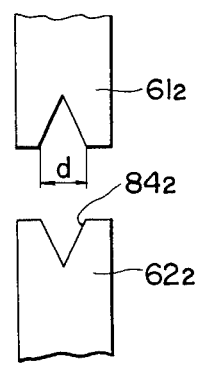
Figure 16A:
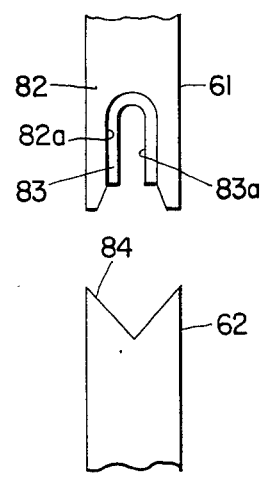
Figure 16B:
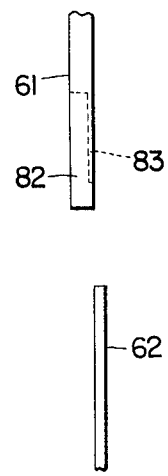
Figure 21B:
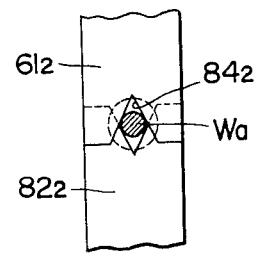
Figure 20A:
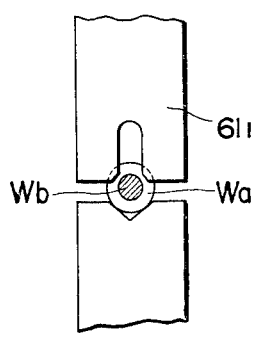
Figure 20B:
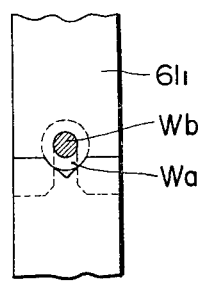
Figure 20C:
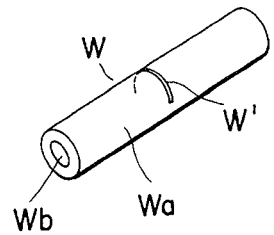
Figure 22:
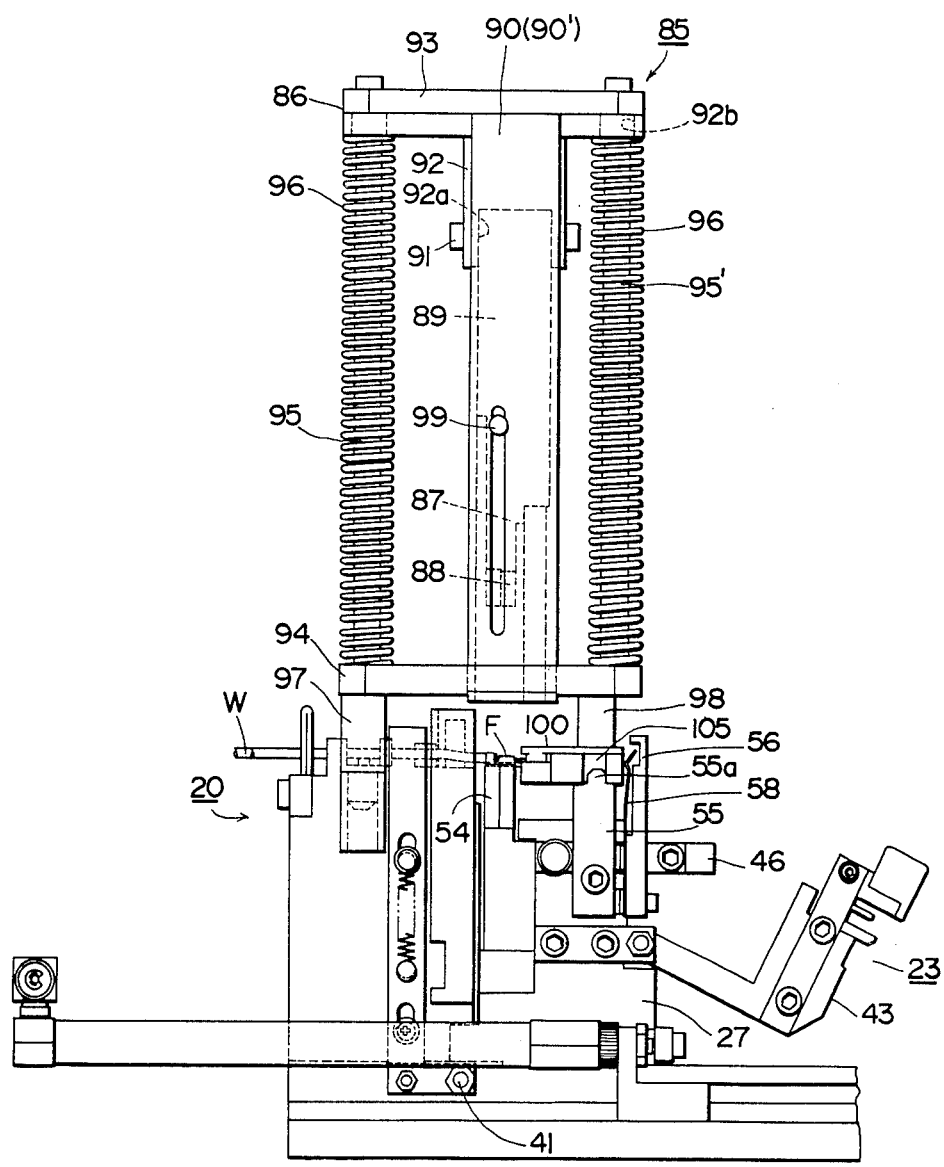
Figure 23:
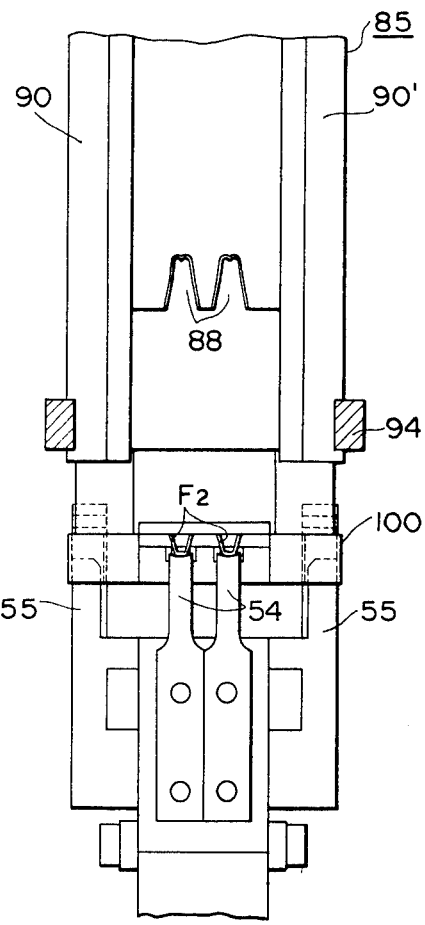
Figure 24:
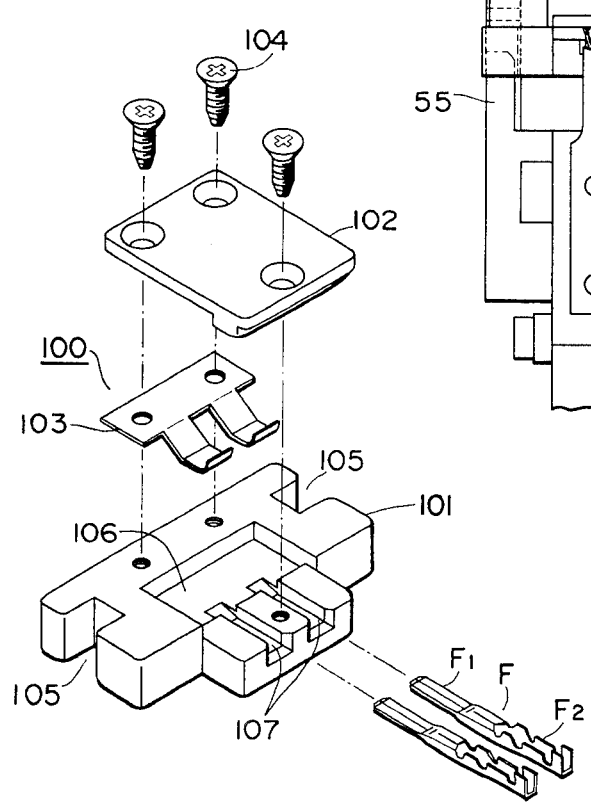
Figure 25:
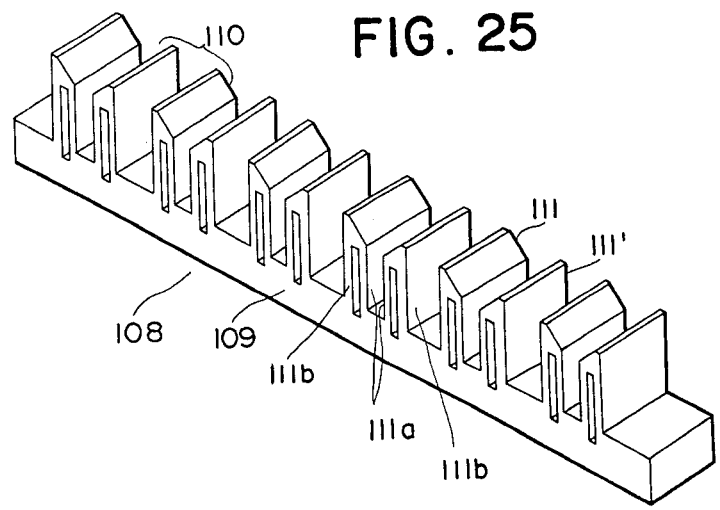
Figure 26:
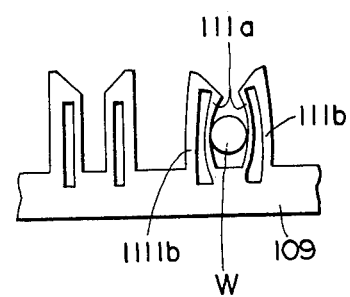

FIGS. 13a to 13b indicate a manner of cutting a wire with the prior art cutting device;

FIGS. 14a and 14b are views demonstrating cooperative actions of the wiring block and clamping jig in locking and cutting a wire;

FIGS. 15a–15c are views showing a wire peeling step and in which FIG. 15a is a side elevation just before peeling, FIG. 15b a fragmentary side elevation during peeling and FIG. 15c a side elevation after peeling;

FIGS. 16a and 16b are front and side views of preferred blades of the insulator remover;

FIG. 17 is a fragmentary front view of blades of a prior art insulator remover;

FIGS. 18a and 18b demonstrate two successive parts of a peeling step performed by the prior art insulator remover;

FIG. 19a is a fragmentary front view of an insulator remover embodying the present invention;

FIG. 19b is a side elevation of the insulator remover shown in FIG. 19a;

FIGS. 20a and 20b show two successive parts of a peeling step achievable with the insulator remover of the invention and FIG. 20c is a perspective view of a wire formed with a cut by the above step;

FIG. 21a is a fragmentary front view of an alternative embodiment of the insulator remover of the invention;

FIG. 21b shows the alternative insulator remover in operation;

FIG. 22 is a side elevation of a device for attaching terminal members to peeled wire ends;

FIG. 23 is an enlarged fragmentary front view of the terminal attaching device;

FIG. 24 is an exploded perspective view of a terminal cassette;

FIG. 25 is a perspective view of a bridge;

FIG. 26 is a view demonstrating an action of the bridge; and

Figure 27:
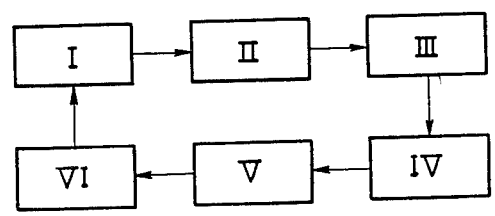

FIG. 27 is a block diagram showing the stations in which the workbench is stationed to sequentially perform the steps of the method of the invention.

DETAILED DESCRIPTION OF THE EMBODIMENTS

The present invention will now be described in detail hereinafter with reference to FIGS. 9–27.

Figure 9:
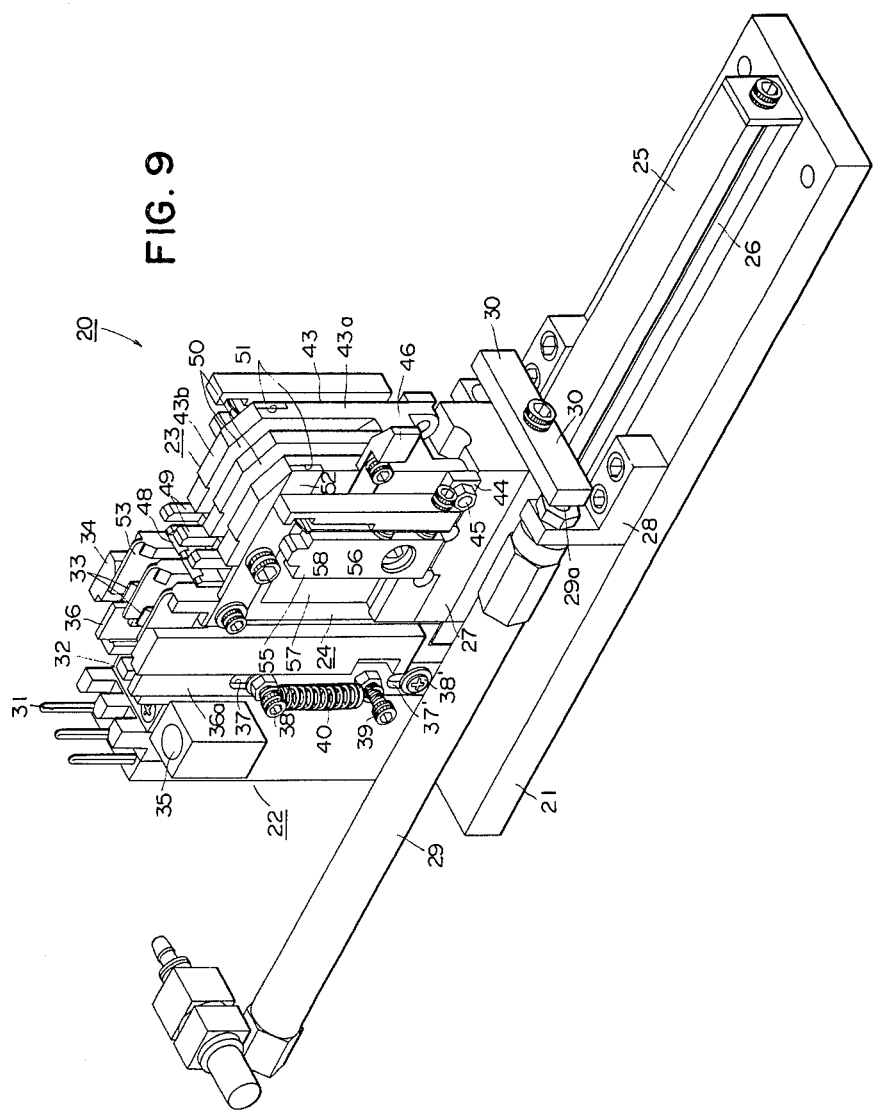
FIG. 9 is a perspective view of a wiring block for practicing a wire harness production method embodying the present invention.

FIG. 9 shows in perspective a wiring block for practicing the method of the present invention. FIG. 10 is a side elevation showing the wiring block with its three cooperative asemblies in open or separated positions relative to each other. The wiring block generally designated by the reference numeral 20 comprises a bed 21 on which a wire clamping section 22, a wire cutting section 23 and a terminal attaching section 24 are supported.

An elongate guide projection 25 extends longitudinally on the top of the bed 21. The guide 25 is formed with a channel 26 longitudinally along each of its laterally opposite side walls. The wire clamping assembly 22 comprises a body 22a which is securely mounted on one longitudinal end of the base 21 while a support member or carriage 27 for the wire cutting section 23 and terminal attaching section is slidably mounted on the guide 25. The assemblies 23 and 24 on the carriage 27 is thus movable toward and away from the section 22 along the guide 25. An air cylinder 29 is secured to the bed 21 by a metal fixture 28. A piston rod 29a emerges from the air cylinder 29 and has its end engaged with a cross bar 30 which is secured to the rear end of a bottom portion of the carriage 27.

The body 22a of the wire clamping section 22 has thereon a plurality of nozzle guide pins 31, a transverse recess 32 for receiving a bridge and a plurality of wire clamping pawls 33 which are arranged successively from the front to the rear.

The pawls 33 are fitted to a generally gate-shaped pawl holder 34 which is detachably mounted on the body 22a of the wire clamping section 22. Thus, the pawls 33 can be readily replaced with others or repaired in the event of critical wear, damage or like trouble in use by merely detaching the pawl holder 34 from the body 22a. At each side the body 22a is provided with a hole 35 for positioning peeling and terminal attaching machines as will be described and a generally L-shaped lock lever 36 adapted to lock the wire cutting section in a predetermined position.

A vertical arm 36a of the L-shaped lock lever 36 is formed with slots 37, 37' one upon the other in which guide pins 38, 38' studded on the body 22a are engaged, respectively. The arm 36a therefore is slidingly movable up and down relative to the body 22a. A tension spring 40 is anchored at one end to the upper guide pin 38 on the body 22a and at the other end to a pin 39 threaded into a lower portion of the vertical arm 36a of the lock lever 36, whereby the lock lever 36 is constantly biased upward by the tension spring 40. A lock pin 41 extends transversely from the inner wall of a horizontal arm 36b which is contiguous with the vertical arm 36a. A lock pawl 42 projects from the front end of a bottom portion of the carriage 27 and is formed with a notch 42a with which the lock pin 41 is engageable to lock the carriage 27 to the wire clamping section 22. Obviously, another lock pawl 42 with a similar notch 42a extends forward from the front end of the support 27 though not shown in the drawings, to engage with a lock pin 41 on the other lock lever 36.

Swingably mounted to the carriage 27 is a generally L-shaped member 43 which serves as a frame of the wire cutting section 23 which is in an interlocking engagement with the terminal press attaching section 24.

The L-shaped frame 43 has a vertical portion 43a as seen in FIG. 9 which is pivotally connected by a threaded pin 45 to the rear end of a mounting plate 44 at the base end thereof. A stop 46 in the form of a flat spring is connected to the carriage 27 to lock the frame 43 in a predetermined raised position relative to the carriage 27. A horizontal upper portion 43b of the frame 43 continuous with the vertical portion 43a is formed with a recess or shoulder 47 at its free end portion to carry a cutter 48 and a plurality of guide pins 49 detachably thereon. A plurality of nozzle guide recesses or grooves 50 extend from an upper part of the front end to the rear end of the horizontal portion 43b of the frame 43. Recesses 51 extend longitudinally on the opposite side walls of the horizontal portion 43b while two mounting plates 52 are received in the recesses 51, respectively. These mounting plate 52 are adapted to hold therebetween a plurality of flat members 53 for causing the pawls 33 to exert an increased clamping force on a wire.

Figure 5:
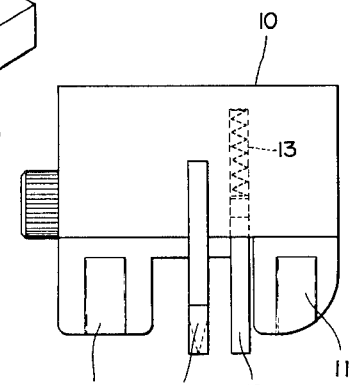
FIG. 5 is an enlarged side elevation of a clamping jig carried on the wiring head.
Figure 4:
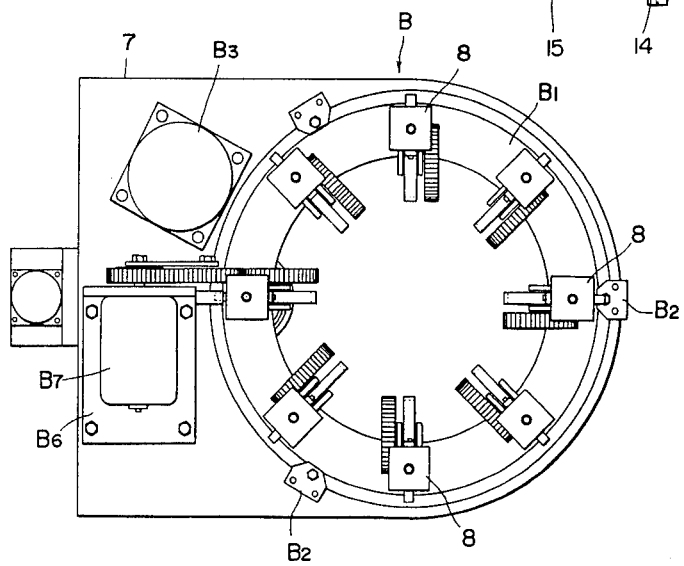
FIG. 4 is a plan view of the wiring head of FIG. 3.
Figure 12:
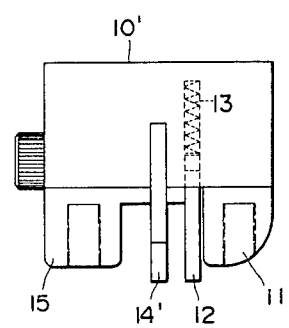
FIG. 12 is an enlarged side elevation of a clamping jig coactive with the wiring block.
Figure 11:
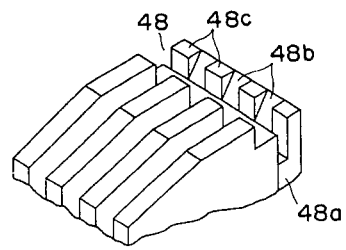
FIG. 11 is an enlarged perspective view of a cutter carried on the wiring block.
Figure 7A:
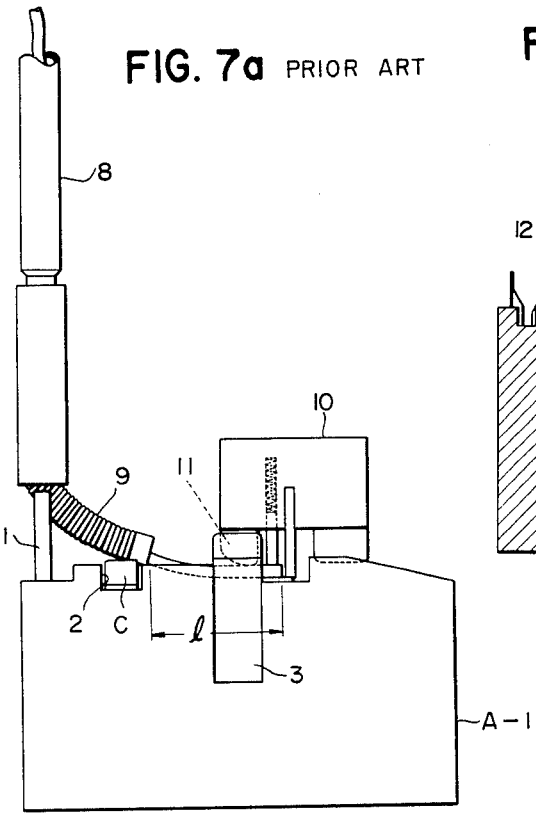
FIGS. 7a–7c are views showing a wiring step performed by the wiring block and the wiring head.
Figure 7B:
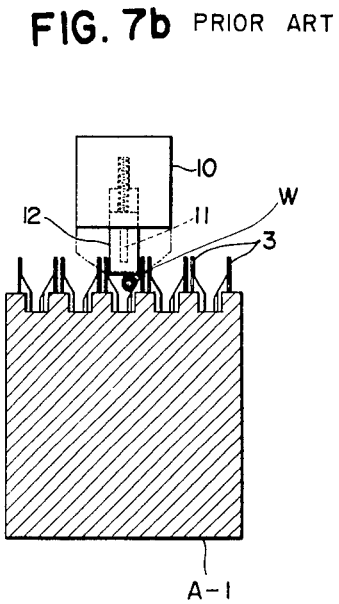

As viewed in FIG. 11, the cutter 48 comprises a body 48a which is formed with a plurality of cutting edges 48b and contact plate bearing surfaces 48c which alternate with the cutting edges 48b. Due to the fact that the cutter 48 is carried on the wiring block 20, use is made of a clamping jig 10' having a contact plate 14' as shown in FIG. 12 in place of the cutter 14 on the clamping jig 10 (see FIG. 5).

The terminal attaching section 24 includes a plurality of anvils 54, a pair of side arms 55 and a pair of rear arms 56. The anvils 54 are detachably mounted upright on an anvil holder 57 which is rigidly connected to the front end of the carriage 27. The anvils 54 alternate with the clamp intensifying plates 53 on the frame 43 of the cutting assembly 23 and have upper ends which are substantially flush with the bottom of the transverse recess 32 on the body 22a of the clamping assembly 22. The side arms 55 and rear arms 56 function to support a terminal cassette which will be described. Each side arm 55 is formed with a lug 55a on its top while a leaf spring 58 is positioned in front of each rear arm 56.

It will thus be seen that the wiring block 20 has on its bed 21 the wire clamping section 22, wire cutting section 23 and terminal attaching section 24, the sections 23 and 24 being movable toward and away from the section 22.

Figure 1:
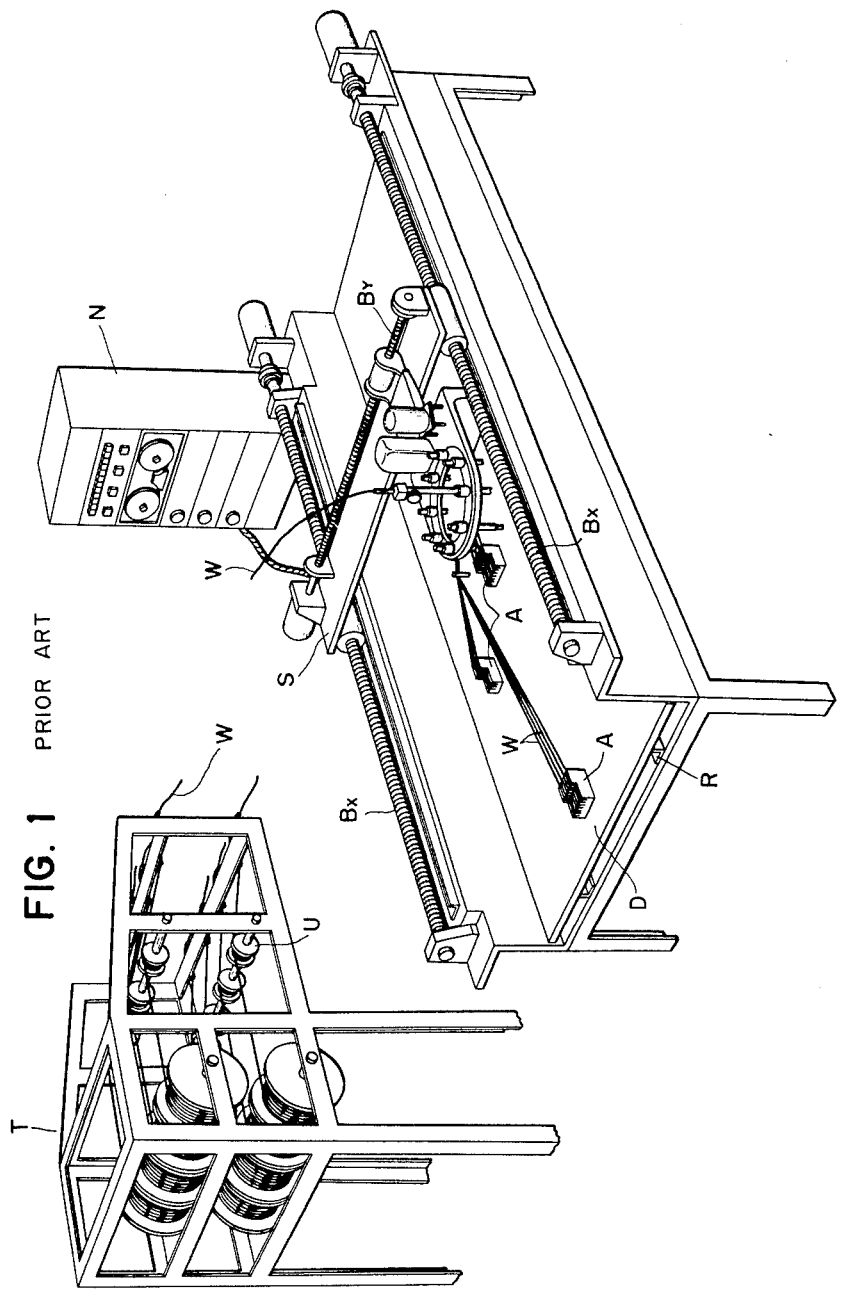
FIG. 1 is a perspective view of a part of a conventional wire harness producing apparatus while the workbench is stationed to be subjected to the wire laying operation.
Figure 2:
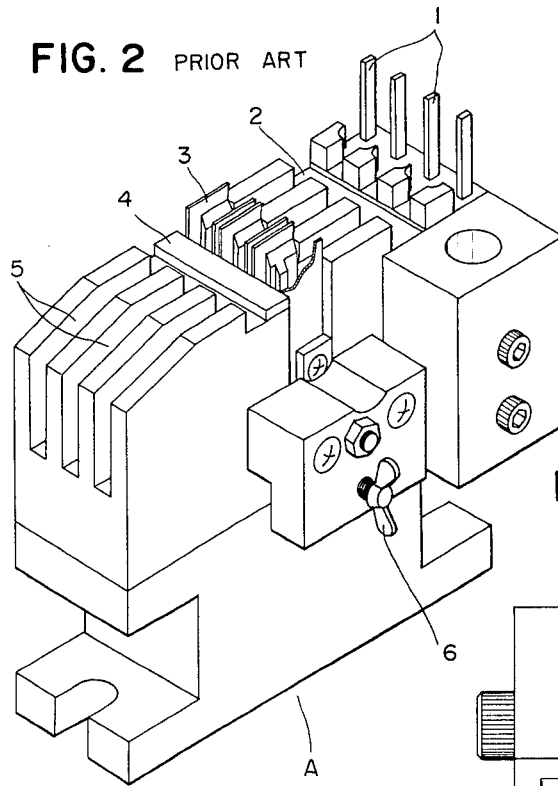
FIG. 2 is a perspective view of a wiring block used in the wire harness producing apparatus illustrated in FIG. 1.
Figure 3:
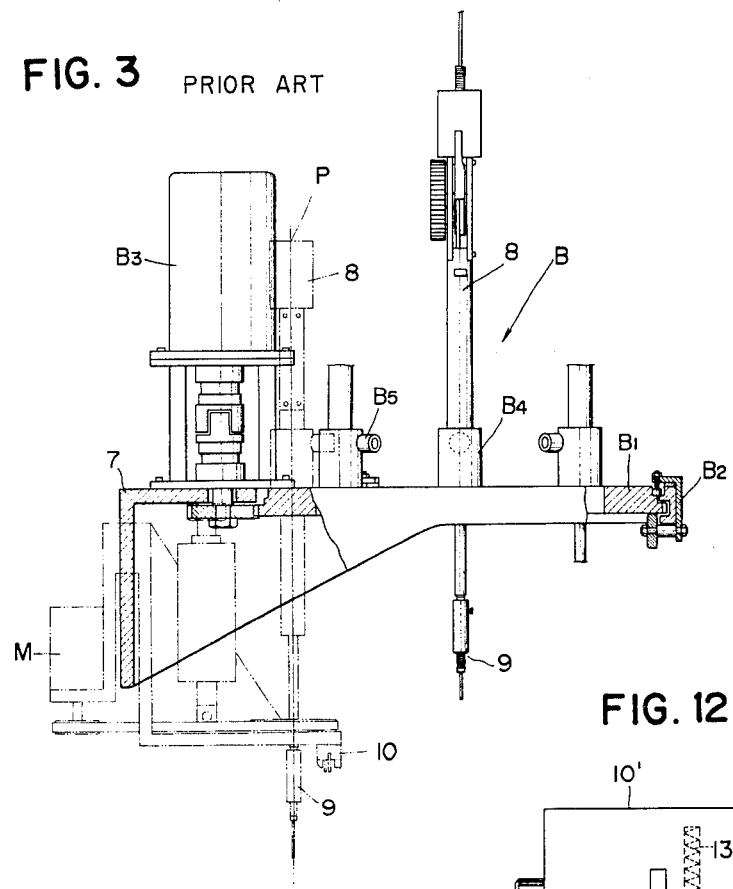
FIG. 3 is a partly exposed side elevation of a wiring head which operates in conjunction with the wiring block.
Figure 8:
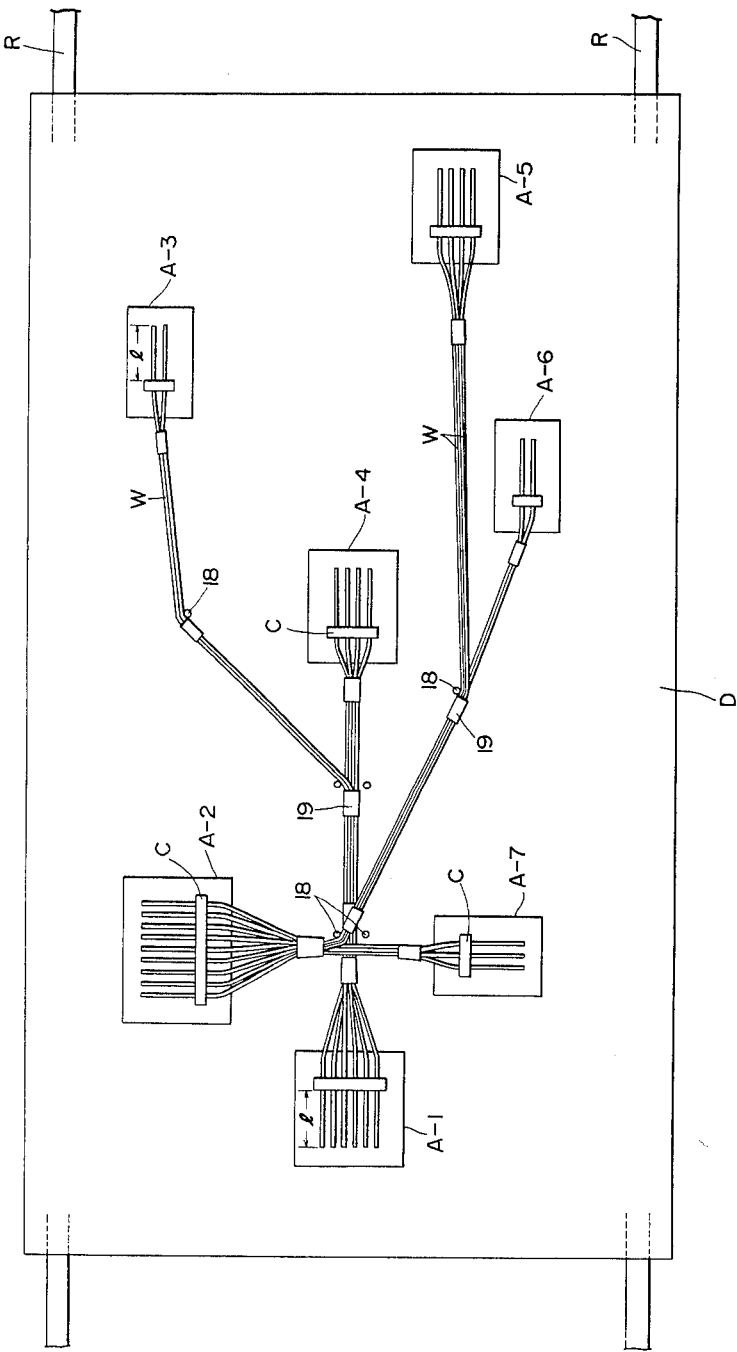
FIG. 8 is a plan view of wire harness formed by the wiring step in FIGS. 7a–7c.

Like the wiring block A (see FIG. 2), the wiring block 20 is provided with plural nozzle guide pins 31, transverse recess 32 for receiving a bridge, clamping pawls 33, cutter 48 and guide grooves 50 which are located in succession on an upper portion of the block 20 from the front end to the rear end. Accordingly, an automatic wire laying operation can be carried out by placing such wiring blocks 20 on workbench D at desired distances as in the case of FIG. 8 and operating the wiring head B indicated in FIG. 3. It should be noted here that the wiring head B this time employs a clamping jig 10' shown in FIG. 12 instead of the clamping jig 10 shown in FIG. 5.

A drawback inherent in the prior art clamping jig 10 is that the wiring block A and clamping jig 10 are unusable when it is desired to bundle a plurality of wires W and join their end portions together. The situation will be explained with reference made to FIGS. 13a and 13b. FIG. 13a indicates a condition wherein a first wire $W_1$ has been nipped between adjacent pawls 3 on a wiring block A with its end laid on the cutter contact surface 4 of the wiring block at a predetermined distance 1 from the pawls 3.

If a second wire $W_2$ is laid on the first wire $W_1$ as shown in FIG. 13b, the first wire $W_1$ will intervene between the second wire $W_2$ and the cutter contact surface 4 preventing the second wire $W_2$ from being cut by the cutter 14. An expedient to settle this problem may be elongating the vertical extent of the cutting edge of the cutter 14. However, this will affect the coactive relationship between the pawls 3 on the wiring block A and the clamping plates 11 and 15 on the clamping jig 10 to such a degree that the plates 11 and 15 practically fail to retain wires in between the pawls 3.

Figure 7C:
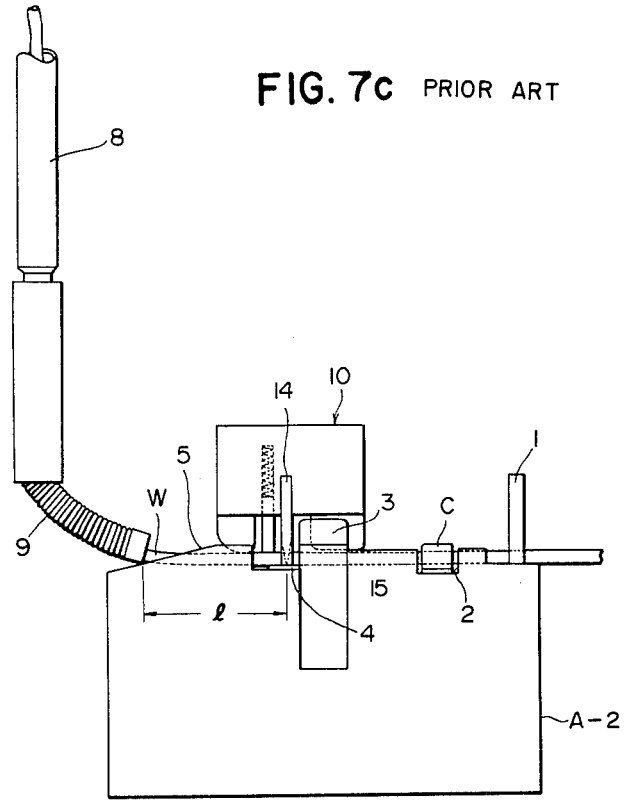

Provision of the cutter 48 on the wiring block 20 and a cutter contact plate 14' on the clamping jig 10' permits a plurality of wires to be retained between a pair of pawls 33 and cut by the cutter 48. This mode of operation is demonstrated in FIGS. 14a and 14b. First, when the clamping jig 10' is lowered onto a first wire $W_1$ retained between adjacent pawls 33, the cutter cuts the wire $W_1$ due to the cooperation of its cutting edge 48b with the cutter contact plate 14' on the jig 10'; this is exactly the same as the procedure shown in FIG. 7c. After laying of a second wire $W_2$ as shown in FIG. 14b, it is pressed into between the pawl 33 by the rear end clamping plate 15 on the jig 10' upon a downward movement of the jig 10'. At this instant, the second wire $W_2$ presses the first wire $W_1$ downward deeper into the gap between the pawls 33 causing the cut end of the first wire $W_1$ to move downward along the flank 48d of the cutting edge 48b. As a result, the second wire $W_2$ is brought into contact with the cutting edge 48b of the cutter 48 to be cut thereby in exactly the same way as in FIG. 14a.

When an automatic wire laying step by the wiring head B and wiring blocks 20 is terminated, the workbench D is transferred to the next working station of peeling station carrying the wires and wiring blocks 20 therewith.

FIGS. 15a–15c illustrate a peeling device and its actions for removing insulator from wire ends.

In FIGS. 15a–15c, the reference numeral 59 denotes a peeling machine which constitutes a peeling device in combination with a wiring block 20 carried on the workbench D. The number of the peeling machines 59 corresponds to that of the wiring blocks 20 on the workbench D. Each peeling machine 59 is movable up and down relative to a wiring block 20 and comprises a casing 60 which is tiltably mounted to a frame (not shown) of the machine. The machine frame is provided with pins which will be engaged in the positioning holes 35 in the body 22a, members for pressing the lock levers 36 and a wire presser plate intervening between the lock lever pressers.

Mounted to a lower part of the front end of the casing 60 are an upper blade 61 for melting the insulator on a wire and a lower blade 62 which will bear a wire during removal of the insulator. These blades 61 and 62 are movable vertically toward and away from each other. The upper or fusing blade 61 is vertically movably fastened by an adjustment screw 64 to a mount 63 which has an electric heating element built therein. The mount 63 is secured to an upper holder 66 by way of a heat insulator 65. The lower or bearing blade 62 is fastened to a lower holder 67 by a screw 68. The upper holder 66 and lower holder 67 are elevatably supported by two guide pins 70, 70' which extend throughout and rigidly held by a frame member 69. Designated by the reference numeral 71 is an air cylinder adapted to move the upper and lower blades 61 and 62 toward and away from each other. The lower end of the air cylinder 71 is threaded into a threaded bore 72 formed in the upper holder 66. A piston rod 71a protrudes from the cylinder 71 and extends throughout a coil spring 73 which is disposed between the upper holder 66 and frame member 69. The piston 71a further extends throughout a bore 74 in the lower holder 67 and, at the underside of the lower holder 67, it is secured to the lower holder 67 by a nut.

A stop screw 75 is threaded into the mount 63 to avoid upward dislocation of the fusing blade 61. The casing 60 carries therewith a first limit switch 76 having a plunger 77. The upper holder 66 has therewith a second limit switch 78 having a plunger 79. The plunger 77 of the limit switch 76 is normally pressed into its retracted position by the upper holder 66 whereas the plunger 79 of the limit switch 78 is normally held in its protruded or free position as shown in FIG. 15a. A pin 80 projects upward from the lower holder 67 in vertically spaced alignment with the plunger 79 of the limit switch 78. The frame member 69 is drilled to have an opening 81 which allows the pin 80 to pass therethrough as will be described.

The blades 61 and 62 for removing insulation are shown in detail in FIGS. 16a and 16b. The fusing blade 61 comprises a reinforcing or supporting plate 82 having a relatively wide inverted U-shaped recess 82a and a thin body 83 having a relatively narrow inverted U-shaped recess 83a and bonded to the support 82 in the illustrated manner. The recess 83a of the body 83 has a width which is substantially equal to the outside diameter of the conductor which is covered by the insulator. The bearing blade 62 on the other hand has a generally V-shaped recess 84 on its top so as to bear a wire thereon.

Now, suppose that the workbench D has arrived at the peeling station which follows the wire laying station. Then a peeling machine 59 corresponding to a wiring block 20 is lowered with its casing 60 held open relative to the machine frame as indicated in FIG. 15a.

Then the lock lever pressers on the machine frame push the lock levers 36 on the wiring block 20 downward to such an extent that the lock pins 41 are released from the lock pawls 42 on the carriage 27. Simultaneously, the wire presser plate on the machine frame firmly holds a wire W from above in the wire clamping section 22. Meanwhile, the air cylinder 29 is actuated to move the associated piston rod 29a outward into abutment with the cross bar 30. Further outward movement of the piston rod 29a causes the carriage to move backward along the guide 25 through the cross bar 30 away from the stationary clamping section 22. The upper and lower blades 61 and 62 are brought to a position where they will face the end of the wire W which has been retained by the pawls 33 on the wiring block 20. In this stage of operation, the blades 61 and 62 are still kept apart from each other.

Thereafter, the casing 60 of the peeling machine swings toward the wire W to the position indicated in FIG. 15b. At the same time, the air cylinder 71 within the casing 60 is moved downward while its piston rod 71a is retracted into the cylinder. Thus, the cylinder 71 moving downward and the piston rod 71a moving upward cause the upper holder 66 and the lower holder 67 to move toward the frame member 69, respectively. This brings the upper and lower blades 61 and 62 closer to each other until they nip the wire W from opposite sides.

Upon the downward movement of the upper holder 66, the plunger 77 of the limit switch 76 is released to actuate the limit swith 76.

Then an electric current is supplied from a power source to the heater built in the mount 63 whereby the upper blade 61 is heated for a moment. As a result, the inverted U-shaped inner edge 83a of the blade 61 bites into the insulator on the wire W applying heat thereto until the insulator is entirely cut by melting. In the meantime, when the upper holder 66 and lower holder 67 are moved toward each other causing the blades 61 and 62 to nip the wire W therebetween the pin 80 on the lower holder 67 will have passed through the opening 81 in the frame member 69 into pressing contact with the plunger 79 of the limit switch 78. Thus actuated, the limit switch 78 cuts off the power supply to the heater upon the lapse of a predetermined period of time through a timer circuit (not shown).

Finally, the casing 60 swings away from the wire W to the position indicated in FIG. 15c. This time, the inverted U-shaped edge 83a of the upper blade 61 removes the insulator from the end of the wire W. In this situation, the air cylinder 71 inside the casing 60 is elevated while the associated piston rod 71a is stretched out from the cylinder, whereby the upper and lower blades 61 and 62 are moved away from each other back to the start positions shown in FIG. 15a. The peeling machine thus gets prepared for another series of actions to remove insulator from another wire.

The peeling operation described above essentially consists in melting a preselected part of the insulator on a wire W by means of the fusing blade 61 with heater means and the bearing blade 62, and removing the insulator from the wire by a swinging action of the casing 60. It will be seen that such a method prevents the conductor of the wire from being damaged and needs a minimum of space for the peeling operation.

The workbench D now carrying the laid and properly stripped wires thereon is shifted to a further station where electric metal terminal members are to be pressed onto the wires.

Conventionally, insulated wires have been peeled by a pair of peeling blades 61', 62' shown in FIG. 17 which are constructed to be movable toward and away from each other through cams and links through not shown in the drawing. Each of the blades 61', 62' has at its end opposite to the other a recessed cutting edges 61'', 62'' whose width are substantially the same as the outside diameter of the conductor of a wire.

The blades 61', 62' in operation are moved toward a wire W from vertically opposite sides of and in perpendicular relation to the wire W as indicated in FIG. 18a. Then the cutting edges 61'', 62'' of the blades 61', 62' penetrate into the wire W to cut the coating or insulator $W_a$ only, as viewed in FIG. 18b. From this position, the blades 61', 62' are moved in the axial direction of the wire W allowing their cutting edges 61'', 62'' to progressively remove the insulator $W_1$.

A major problem inherent in such a peeling system is that the blades 61', 62' tend to damage the conductor $W_b$ of the wire W and thereby cause it to break when an electric terminal member is fitted thereto for example. With this tendency in mind, the maximum allowable distance the blades 61', 62' approach each other needs be adjusted frequently by time-consuming manual work.

Thus, the blades 61 and 62 shown in FIGS. 16a and 16b are preferable. Modifications of such blades are further shown in FIGS. 19a to 21b. In FIGS. 19a and 19b, the insulator remover comprises a fusing blade $61_1$ and a bearing blade $62_1$ which faces the fusing blade $61_1$ from below. The blades $61_1$ and $62_1$ are arranged to be movable toward and away from each other or along the axis of a wire as desired through a known cam and link mechanism or the like.

The fusing blade $61_1$ comprises a flat plate having a generally inverted U-shaped recess or groove $83a_1$ at its end which faces the bearing blade $62_1$. The laterally opposite walls of the recess $83a_1$ are spaced a distance which is substantially the same as the outside diameter of the conductor of a wire. A heater plate 83 is carried on the back of the fusing blade as viewed in FIG. 19b while an electric heating element (not shown) is built in the heater plate 83'. The heater plate 83' functions to reinforce the fusing blade $61_1$ as well as to heat the same as will be described. Likewise, the bearing blade $62_1$ is in the form of a flat plate which is provided with a generally V-shaped recess or groove 84 at its end which opposes the fusing blade $61_1$.

In operation, the blades $61_1$ and $62_1$ are moved toward each other from above and below a wire W so that the wire W becomes engaged by the edge of the recess $83a_1$ and supported by the edge of the recess as shown in FIG. 20a. As the blade $61_1$ is further moved downward relative to the blade $62_1$, the opposite walls of the recess $83a_1$ spaced the same extent as the outside diameter of the conductor $W_b$ of the wire W bite into the diametrically opposite sides of the insulator $W_a$ while melting them by heat. When the blade $61_1$ is moved still further downward, the uppermost semicylindrical part of the recess $83a_1$ penetrates into the insulator $W_a$ over the upper semicylindrical peripheral portion of the latter as shown in FIG. 20b. The blade $61_1$ in this way forms a semicircular break or rent W' throughout the insulator $W_a$ as viewed in FIG. 20c. It will be apparent that the heater element inside the heater plate 83' is kept energized by a power source (not shown) during the course of the melting operation. Thereafter, as has been the case with the conventional system, the blades $61_1$ and $62_1$ like the blades 61', 62' are moved together along the axis of the wire W to peel the wire W over a desired length.

Another modification of the insulator remover is illustrated in FIGS. 21a and 21b. As shown in FIG. 21a, the insulator remover comprises a pair of identical fusing blades $61_2$, $62_2$ which are positioned in vertically or laterally symmetric relation to each other.

Each fusing blade $61_2$ is formed with a generally V-shaped recess or groove $84_2$ at its end which opposes the other. The open end of the recess $84_2$ has a lateral dimension d which is sufficiently larger than the outside diameter of the insulator $W_a$ of a wire W. Each blade $61_2$ carries a heater plate (not shown) on the back thereof as in the case of the fusing blade $61_1$.

With this alternative design, the paired fusing blades $62_2$ serve as bearing members for each other. When the blades $61_2$ are caused to come into contact with the insulator $W_a$ which covers the conductor $W_b$, the edges of their V-shaped recesses penetrate into the insulator $W_a$ forming breaks or rents throughout the insulator at four crosswise locations. During the subsequent axial movement of the blades $61_2$ $62_2$, the insulator $W_1$ is placed under a substantially even distribution of tensions due to the rents W'' at crosswise locations and thereby peeled in a smooth way.

While each fusing blade $61_1$ or $62_1$ has been shown and described to carry an independent heater plate 83' therewith, it is permissible to employ direct heating means such as making the fusing blade itself of an electrical resistor, only. It will thus be seen that wires are free from accidental cuts conventionally observed and which would lead to breakage of the wires. This eliminates the need for a time-consuming operation for adjusting the distance the blades are movable toward each other, that is, for protecting wires from damage, promoting safe and positive removal of insulator from wires.

A device for attaching terminal members to wires is shown in side elevation in FIG. 22 and in fragmentary enlarged front elevation in FIG. 23.

As shown, a terminal attaching machine 85 constitutes the terminal attaching device in cooperation with a wiring block which will then have the wire cutting assembly 23 tilted downward out of the terminal attaching assembly 85.

The machine 85 includes a frame 86 which corresponds to a wiring block 20 carried on the workbench D. The frame 86 has therein an elevatable pressing bar 87.

The pressing bar 87 is detachably mounted on a holder 89 and formed at its lower end with recesses 88 which will cooperate with the anvils 54 on the terminal attaching assembly 24. The machine frame 86 includes two flat posts 90, 90' by which the holder 89 is guided to move up and down. The upper end of the holder 89 is received in a bore 92a of a holder mount 92 and secured thereto by a screw 91. Guide pins 95, 95' extend individually from an upper member 93 to a lower member 94 of the machine frame 86. The holder mount 92 is formed with openings 92b at opposite sides thereof in which the guide pins 95, 95' are engaged, respectively. Coiled compression springs 96 are disposed between the underside of the holder mount 92 and the lower frame member 94 and around the individual guide pins 95, 95' so that the holder mount 92 is constantly biased upward toward the upper frame member 93. Extending downward from the underside of the lower frame member 94 are pins 97 engagable in the positioning holes 35 in the wiring block 20 and other pins 98 engagable with the lugs 55a on the side arms 55. The flat post 90 (90') is formed with an elongate slot in which an adjusting screw 99, for adjusting the vertical position of the bar 87, is engaged.

Terminal members are carried by a terminal cassette 100 which is shown in exploded perspective in FIG. 24.

The terminal cassette 100 comprises a body 101 and a closure member or lid 102 between which a retainer spring 103 is interposed. The body 101 and lid 102 are fastened together by screws 104 with the retainer spring 103 held therebetween. The body 101 has notches 105 at opposite sides thereof, a generally rectangular recess 106 for receiving the retainer spring 103, and channels 107 at its front end which are continuous with the recess 106 to allow insertion of terminal members F. The notches 105 are dimensioned somewhat larger than the lugs 55a on the side arms 55 on the wiring block 20 so that the notches 105 will be coupled on the lugs 55a with some play.

Before a terminal fitting step begins, electric contact portions $F_1$ of the terminal members F are inserted into the channels 107 of the terminal cassette 100 and nipped between the body 101 and retainer spring 103 inside the recess 106.

The cassette 100 with the terminal members F is loaded on the slide block of the wiring block 20. More specifically, the resilient stop 46 on the slide block 27 is pulled outwardly away from the L-shaped frame 43 of the wire cutting assembly 23 whereupon the frame 43 is tilted rearwardly about the pin 45 to the position shown in FIG. 22. Under this condition, the cassette 100 is loaded on the slide block 27 with its notches 105 coupled loosely on the lugs 55a of the side arms 55. The other portions $F_2$ of the terminal members F protruding from the cassette 100 become supported by the anvils 54 while the leaf springs 58 associated with the rear arms 56 hold the cassette 100 in a slightly forwardly urged state. The slide block 27 is moved from the position remote frome the clamping assembly 22 back to the position near the same until the lock pawls 42 are engaged with the lock pins 41.

The procedure so far described in connection with the terminal attaching station comprises manual work. A sufficiently long period of time is available for such manual work because a substantial time period will be consumed at the wire laying station to lay a number of wires on a workbench D. Another advantage achievable with the manual work is that incomplete fitting of terminal members to wires is eliminated which would affect the whole wire harness.

After the manual operations, the terminal fitting machine 85 is lowered toward the wiring block 20 until the frame 86 is positioned properly on the wiring block 20 with the pins 97 received in the holes 35 and the pins 98 abutted against the lugs 55a.

Then a press ram (not shown) is actuated to push the holder mount 92 and therefore the bar 87 downward. The recesses 88 at the bottom of the bar 87 cooperate with the anvils 54 to press the portions $F_2$ of the terminal members F firmly onto the conductors of the wires W. Thereafter, the press ram is elevated back to its inoperative position so that the holder mount 92 is allowed to restore the raised position by the compression springs 96.

Figure 6:
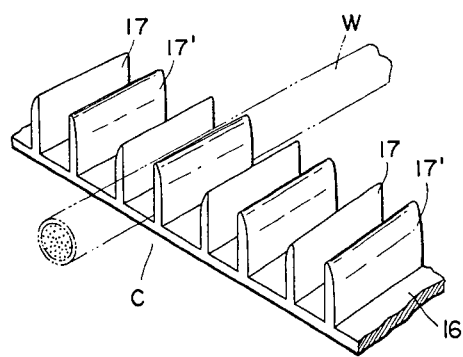
FIG. 6 is a perspective view of a bridge to be placed on the wiring block.

In this way, the wiring block 20 not only functions to retain, lay and cut wires in cooperation with the wiring head B but serves to peel wires and attach terminal members to the peeled wires in collaboration with the terminal attaching machine 85. The latter function realized by the present invention results from the inherent arrangement wherein the wire cutting section 23 and terminal attaching section 24 are movable into and out of their coactive position with the wire clamping section 22. Consequently, in the event wires laid between wiring blocks 20 are to be transferred from the wire laying station to the peeling and terminal attaching stations, they do not have to be removed from the wire clamping sections of the wiring blocks and, therefore, bridges heretofore employed to firmly hold them at spaced locations are needless. It is thus preferable to replace the conventional fusible bridges C (see FIG. 6) by bridges which can be detachably fitted to wire ends and taken off therefrom after putting of the terminal members in electric connectors.

An example of such a preferred bridge is illustrated in FIG. 25. The bridge 108 has a strip of base 109 on which are formed a plurality of parallel wire nipping portions 110 each of which consists of a pair of opposing elastic nipping members 111, 111'. Each nipping member 111 or 111' is made up of an elastic inner wall 111a and an elastic outer wall 111b contiguous with the inner wall 111a. The inner walls 111a of the paired nipping members 111 are spaced a distance which is slightly smaller than the outside diameter of a wire. When a wire W is pressed into the gap between the nipping members 111, 111', the inner walls 111a will be bent by the wire W toward the corresponding outer walls 111b thereby elastically and securely holding the wire W therebetween as shown in FIG. 26.

With the above-described structure, the bridge 108 can be detachably fitted to wire ends and, in addition, at any stage of production. Bridges 108 may be loaded in the transverse recesses 32 on wiring blocks which are placed in desired locations on a workbench, so as to nip wire ends simultaneously with laying of the wires between the wiring blocks 20. Alternatively, they may be fitted to wire ends any one of the working steps from laying of wires to attaching of terminal members to wire ends or even after the removal of wires from the wiring blocks 20. Furthermore, the bridges 108 may be taken off from the wire ends once the terminal members are attached to electrical connectors.

While the foregoing description has concentrated on an arrangement wherein the wire cutting assembly 23 on the wiring block 20 is swingably mounted to the slide block 27, the gist is that the wire cutting assembly 23 and a terminal fitting section by separable from each other and movable toward and away from the wire clamping section 22. Various modifications in design may be made in this respect. Also, the cutter 48 in the wire cutting section 23 may be replaced by the conventional cutter contact surface 4 (FIG. 2) and used in combination with the known clamping jig 10.

In the peeling machine 59, the upper and lower blades 61 and 62 which remove insulator by melting it may be substituted for by a pair of upper and lower blade members each of which has a U-shaped or V-shaped recess at its cutting edge.

Though terminal members F have been shown and described as being fitted one by one to wire ends by the use of a terminal cassette, the side arms 55, rear arms 66 and the like elements of the terminal attaching assembly 24 may be so modified as to permit the use of a train of transversely interconnected terminal members.

Referring to FIG. 27, after insulated wires are laid on a plurality of wiring blocks arranged on a workbench beforehand and cut at station I, the workbench is moved to station II, where the wires are subjected to the peeling operation. Then, the workbench is further moved to station III where terminal cassettes are loaded on the slide blocks. Thereafter, the workbench is shifted to station IV where the wire ends and the terminals in the cassette are subjected to the terminal fitting operation. After the terminals are fitted on the wire ends, the workbench is further moved to station V where tape winding operation is performed. Then, the workbench is moved back to station VI where the wire harness is released from the wiring blocks.

It will be appreciated from the foregoing that a method according to the present invention not only peels wires and attaches terminals to the peeled wires without any substantial time interval after laying the wires, but permits bridges for retaining wire ends to be attached or detached before the wire laying step or at any desired one of various steps from laying wires to attaching terminals onto the wires. Such continuity in the production steps, coupled with the omission of fusion of bridges heretofore employed, simplifies the procedure for the production of wire harnesses and offers a substantial decrease in the time period necessary for the same, realizing a noticeable reduction in cost.

What is claimed is:

1. A method of automatically producing a wire harness by use of a plurality of wiring blocks arranged on a workbench at spacings which conform to an intended design of a wire harness, each wiring block having a wire clamping section, a wire cutting section and a terminal press attaching section, said wire cutting section and said terminal press attaching section being adapted for movement toward and away from said wire clamping section, said method comprising the steps of (1) laying an insulated wire from one wiring block to another wiring block, the wire cutting section and the terminal press attaching section of each wiring block being integrally assembled and supported on a bed with the wire clamping section, to ensure that each wire clamping section clamps the wire while cutting said wire to leave at least one piece of insulated wire having a predetermined length extending on said two wiring blocks;
(2) separating said wire cutting section and terminal press attaching section from said wire clamping section to define a predetermined gap therebetween;
(3) peeling an end portion of the laid wire to remove insulating covering therefrom;
(4) moving said terminal press attaching section to the wire clamping section and;
(5) attaching a terminal to end portion of the laid wire by means of a terminal press.

2. A method according to claim 1, wherein said wire cutting section and said terminal press attaching section are moved independently of each other relative to the wire clamping section.

3. A method according to claim 1, wherein said wire cutting section and said terminal press attaching section are moved relative to the wire clamping section and pivoted about a common axis to cause an angular displacement relative to each other.

4. A method according to any one of claims 1 to 3, further including a step of (6) placing at least one terminal on the terminal press attaching section of the wiring block prior to the step (4).

5. A method according to claim 4, wherein said at least one terminal is held by a cassette while being placed on the terminal press attaching section.

6. A method of automatically producing a wire harness by use of a plurality of wiring blocks arranged on a workbench at spacings which conform to an intended design of a wire harness, each wiring block having a wire clamping section, a wire cutting section and a terminal press attaching section, said wire cutting section and said terminal press attaching section being adapted for movement toward and away from said wire clamping section, and said workbench being adapted to be transferred through a plurality of stations, said method comprising the steps of (1) laying an insulated wire from one wiring block to another wiring block at a wire laying station, the wire cutting section and the terminal press attaching section of each wiring block being integrally assembled and supported on a bed with the wire clamping section, to ensure that each wire clamping section clamps the wire while cutting said wire to leave at least one piece of insulated wire having a predetermined length extending on said two wiring blocks;
(2) transferring said workbench from said wire laying station to a wire peeling station while separating said wire cutting section and terminal press attaching section from said wire clamping section to define a predetermined gap therebetween;
(3) positioning wire end peeling means in said gap;
(4) peeling end portions of the laid wire to remove insulating covering therefrom;
(5) transferring said workbench from said wire peeling station to a terminal press attaching station while moving said terminal press attaching section to the wire clamping section; and
(6) attaching a terminal to the peeled end portions of the laid wire by means of a terminal press attaching operation.

7. A method according to claim 6, wherein said wire cutting section and said terminal press attaching section is moved independently of each other relative to the wire clamping section.

8. A method according to claim 6, wherein said wire cutting section and said terminal press attaching section are moved relative to the wire clamping section and pivoted about a common axis to cause an angular displacement relative to each other.

9. A method according to any one of the claims 6 to 8, further including a step of (7) placing at least one terminal on the terminal press attaching section of the wiring block prior to the step (6).

10. A method according to claim 9, wherein said at least one terminal is held by a cassette while being placed on the terminal press attaching section.

11. A method according to claim 9, further including a step of (8) winding a tape around said wire subsequent to the step (6).

12. A method according to claim 11, further including a step of (9) releasing the wire from the wiring blocks subsequent to the step (8).

13. A method according to claim 12, wherein the steps (1) to (9) are repeated a predetermined number of times.

14. A method according to claim 6, further including a step of (10) placing detachable bridges on the wiring blocks prior to said step (1).

15. A method according to claim 12, further including a step of (11) attaching detachable bridges to the wire subsequent to the step (1) and prior to the step (8).

16. A method according to claim 12, further including a step of (12) attaching connectors to the press attached terminals subsequent to the step (9).

17. A method according to claim 16, further including a step of (13) removing said detachable bridges subsequent to said step (12).

18. An apparatus for producing a wire harness comprising a workbench slidable along a plurality of stations to travel from one station to another;

a plurality of wiring blocks arranged on said workbench at spacings which conform to an intended design of a wire harness and each having a wire clamping section supported on a bed, a wire cutting section supported on said bed, and a terminal attaching section supported on said bed, said wiring cutting section and said terminal attaching section being mounted on carrier means movable on said bed whereby they can be moved toward and away from the wire clamping section; a wiring head provided above one of the stations to lay at least one piece of insulated wire between any selected wiring blocks, means movably supporting said wiring head and operable to locate said wiring head at a desired position with respect to said selected blocks, said wire cutting section and terminal attaching section being kept in close contact with the wire clamping section during said laying of the wires;

a peeling assembly provided in association with another one of the stations, means mounting said peeling assembly for movement relative to the terminal clamping section to face the wire clamping section such that an end portion of the laid wire is subjected to a peeling operation to remove insulating covering therefrom, said wire cutting section and said terminal attaching section being kept away from the wire clamping section to define a space to receive the peeling assembly during the peeling operation; and a terminal press attaching assembly provided in association with a further one of the stations, means being provided to move said terminal press attaching assembly relative to the terminal attaching section.

19. An apparatus according to claim 18, wherein said peeling assembly is adapted for vertical movement.

20. An apparatus according to claim 18, wherein said terminal press attaching assembly is adapted for vertical movement.

21. An apparatus according to claim 18, wherein each wiring block has a carriage comprising said carrier means movable toward and away from said clamping section, said wire cutting section and said terminal attaching section being mounted on said carriage.

22. An apparatus according to claim 21, wherein said wire cutting section and said terminal attaching section are in an interlocking engagement, both sections being adapted to disengage from each other.

23. An apparatus according to claim 22, wherein said wire cutting section includes a plurality of L-shaped frames pivotally mounted on the carriage.

24. An apparatus according to claim 18, wherein said wiring head includes a wiring head body movably mounted by means such that said head body can be moved along X and Y axes over said one of the stations a wiring jig mount mounted on said wiring head body, said wiring jig mount being adapted to rotate in a horizontal plane;

a plurality of wiring jigs with each jig being insertable through a guide pipe with said guide pipe having ends which protrude from the top surface and bottom surface of said wiring jig mount, said wiring jigs having a wire payed out therethrough means for raising and lowering selected ones of said wiring jigs in said pipes at a predetermined position; and a clamping jig mounted on the wiring head body and adapted for vertical movement relative to the said wiring head body and circular movement about the selected wiring jig positioned at said predetermined position.

25. An apparatus according to claim 24, wherein said clamping jig has a front end clamping plate, a rear end clamping plate, and a cutter contact plate between said two plates; and a wire cutting section of the wiring block has a cutter in facing relation to said cutter contact plate.

26. An apparatus according to claim 18, wherein said wire clamping section has a plurality of nozzle guide pins aligned with spacings therebetween, a bridge receiving recess in parallel to the nozzle guide pins, and plural of pairs of wire clamping pawls.

27. An apparatus according to claim 23, wherein each L-shaped member has a vertical portion pivotally mounted on the carriage at one end thereof and a horizontal portion extending from another end of the vertical portion.

28. An apparatus according to claim 27, wherein said wire clamping section has a plural pairs of wire clamping pawls and said L-shaped members are spaced from each other to define nozzle guide gaps therebetween, each member having a clamp intensifying plate at its tip, said plate being adapted to be inserted between the clamping pawl pairs.

29. An apparatus according to claim 25, wherein said cutter has a plurality of cutting edges and contact plate bearing surfaces alternating with each other.

30. An apparatus according to claim 18, wherein said peeling assembly has a pair of cutters each adapted to move toward and away from each other, said peeling assembly being adapted for pivotal movement to pinch a wire clamped on the clamping section of the wiring block.

31. An apparatus according to claim 30, wherein said pair of cutters includes edged blades, at least one of said blades having a U-shaped or V-shaped recess to retain a wire.

32. An apparatus according to claim 30, wherein said pair of cutters includes blades, each being backed by heating means and at least one of the blades having a U-shaped or V-shaped recess to retain an insulated wire.

33. An apparatus according to claim 18, wherein said terminal press attaching assembly includes a frame adapted to be set on said wiring block;

an elevatable pressing bar mounted in said frame and having at least one recess on its bottom;

resilient means operably connected with said pressing bar to urge said elevatable pressing bar upward; and press ram means mounted in association with said pressing bar and operable for lowering said elevatable pressing bar.

* * * * *